United States Patent
Hashinaga

(10) Patent No.: US 12,556,141 B2
(45) Date of Patent: Feb. 17, 2026

(54) HIGH-FREQUENCY DEVICE AND DOHERTY AMPLIFIER

(71) Applicant: Sumitomo Electric Industries, Ltd., Osaka (JP)

(72) Inventor: Tatsuya Hashinaga, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 471 days.

(21) Appl. No.: 18/101,153

(22) Filed: Jan. 25, 2023

(65) Prior Publication Data

US 2023/0291358 A1 Sep. 14, 2023

(30) Foreign Application Priority Data

Mar. 14, 2022 (JP) .................. 2022-038785

(51) Int. Cl.
*H03F 1/02* (2006.01)
*H03F 3/21* (2006.01)

(52) U.S. Cl.
CPC ........... *H03F 1/0288* (2013.01); *H03F 3/211* (2013.01)

(58) Field of Classification Search
CPC .............................. H03F 1/0288; H03F 3/211
USPC ...................................................... 330/295
See application file for complete search history.

(56) References Cited

U.S. PATENT DOCUMENTS

| 2002/0118523 | A1 | 8/2002 | Okabe et al. |
| 2004/0227227 | A1 | 11/2004 | Imanaka et al. |
| 2004/0259317 | A1 | 12/2004 | Ding |
| 2020/0053883 | A1 | 2/2020 | Inoue |
| 2020/0186097 | A1* | 6/2020 | Hue ................ H03F 3/604 |
| 2021/0320625 | A1 | 10/2021 | Hashinaga et al. |

FOREIGN PATENT DOCUMENTS

JP 2019-176149 A 10/2019

OTHER PUBLICATIONS

Feng et. al., "(Ba, Sr)TiO3/polymer dielectric composites—progress and perspective", Journal of Progress in Materials Science, Elsevier May 3, 2021 (Year: 2021).*
Extended European Search Report issued on Aug. 8, 2023 for European Patent Application No. 23153053.6.

* cited by examiner

*Primary Examiner* — Hafizur Rahman
(74) *Attorney, Agent, or Firm* — Volpe Koenig

(57) ABSTRACT

A high-frequency device includes a metal base, a dielectric substrate mounted on the metal base, an insulator layer provided on the metal base, covering the dielectric substrate, and having a dielectric constant smaller than that of the dielectric substrate, and a first line that overlaps the dielectric substrate as seen from a thickness direction of the insulator layer and is provided on an upper surface of the insulator layer to form a first microstrip line.

10 Claims, 21 Drawing Sheets

HIGH-FREQUENCY DEVICE AND DOHERTY AMPLIFIER

CROSS REFERENCE TO RELATED APPLICATIONS

This application claims priority based on Japanese Patent Application No. 2022-038785, filed on Mar. 14, 2022, and the entire contents of the Japanese patent applications are incorporated herein by reference.

FIELD

The present disclosure relates to a high-frequency device and a Doherty amplifier.

BACKGROUND

There is known a semiconductor device in which a circuit element and a semiconductor chip are mounted face-up on a metal base in a package including the metal base and an insulating frame provided on the metal base, and the semiconductor chip is electrically connected to a pattern on the insulating frame using a bonding wire (for example, Patent Document 1: Japanese Patent Application Laid-Open No. 2019-176149).

SUMMARY

A high-frequency device according to the present disclosure includes: a metal base; a dielectric substrate mounted on the metal base; an insulator layer provided on the metal base, covering the dielectric substrate, and having a dielectric constant smaller than that of the dielectric substrate; and a first line that overlaps the dielectric substrate as seen from a thickness direction of the insulator layer and is provided on an upper surface of the insulator layer to form a first microstrip line.

A Doherty amplifier according to the present disclosure includes: a distributor distributing a high-frequency signal into a plurality of high frequency signals; a main amplifier amplifying one of the high frequency signals distributed by the distributor; a peak amplifier amplifying the other of the high-frequency signals distributed by the distributor; a combiner combining the high-frequency signal amplified by the main amplifier and the high-frequency signal amplified by the peak amplifier; a metal base; a first semiconductor chip mounted on the metal base and having the main amplifier formed thereon; a second semiconductor chip mounted on the metal base and having the peak amplifier formed thereon; a dielectric substrate mounted on the metal base and having a first conductor pattern formed on an upper surface thereof and a second conductor pattern formed on a lower surface thereof to form a microstrip line along with the first conductor pattern and the second conductor pattern; an insulator layer provided on the metal base, covering the first semiconductor chip, the second semiconductor chip and the dielectric substrate, and having a dielectric constant smaller than that of the dielectric substrate; a first wiring provided on an upper surface of the insulator layer and electrically connecting an output electrode of the main amplifier in the first semiconductor chip and a first end of the microstrip line; and a second wiring provided on the upper surface of the insulator layer and electrically connecting a second end of the microstrip line and the combiner.

DETAILED DESCRIPTION OF EMBODIMENTS

Figure 1:
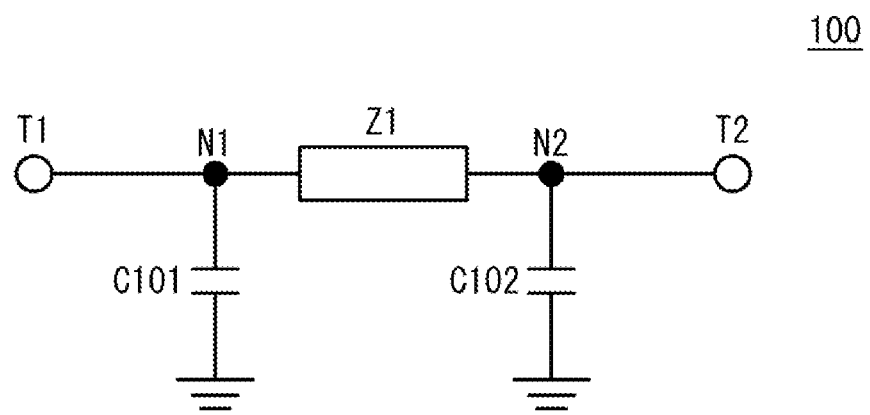
FIG. 1 is a circuit diagram of a high-frequency device according to a first embodiment.

In Patent Document 1, high-frequency characteristics are deteriorated because a high-frequency signal is transmitted through the bonding wire. Although it is conceivable to use a microstrip line as the transmission line, the line becomes large and the high-frequency device is increased in size.

The present disclosure has been made in view of the above problems, and an object of the present disclosure is to provide a high-frequency device and a Doherty amplifier capable of reducing in size.

Description of Embodiments of the Present Disclosure

First, the contents of the embodiments of this disclosure are listed and explained.

(1) A high-frequency device according to the present disclosure includes: a metal base; a dielectric substrate mounted on the metal base; an insulator layer provided on the metal base, covering the dielectric substrate, and having a dielectric constant smaller than that of the dielectric substrate; and a first line that overlaps the dielectric substrate as seen from a thickness direction of the insulator layer and is provided on an upper surface of the insulator layer to form a first microstrip line.

Thus, it is possible to provide a high-frequency device capable of reducing in size.

(2) The dielectric substrate may include a first conductor pattern provided on an upper surface of the dielectric substrate, and the first line may be electrically connected to the first conductor pattern.

(3) The dielectric substrate may include a second conductor pattern provided on a lower surface of the dielectric substrate and bonded to the metal base, and the first conductor pattern and the second conductor pattern may form a first capacitor.

(4) The dielectric substrate may include a third conductor pattern provided on the upper surface of the dielectric substrate and separated from the first conductor pattern on the upper surface of the dielectric substrate to form a second capacitor along with the second conductor pattern, and the first line may electrically connect the first conductor pattern and the third conductor pattern.

(5) A region of the first line which does not overlap with a metal layer provided on the upper surface of the dielectric substrate when viewed from the thickness direction of the insulator layer may be equal to or more than a half of a whole region of the first line.

(6) The high-frequency device may further include a second line which does not overlap with the dielectric substrate when viewed from the thickness direction of the insulator layer and is provided on the upper surface of the insulator layer to form a second microstrip line along with the metal base.

(7) The high-frequency device may further include a semiconductor chip provided on the metal base. The insulator layer may cover the semiconductor chip.

(8) The high-frequency device may further include: an electronic component mounted on the insulator layer; and a wiring provided on an upper surface of the insulator layer and connecting the semiconductor chip and the electronic component.

(9) The high-frequency device may further include a semiconductor chip mounted on the metal base and including an amplifier. The insulator layer may cover the semiconductor chip. The dielectric substrate may include a first conductor pattern provided on an upper surface of the dielectric substrate and a second conductor pattern provided on a lower surface of the dielectric substrate and bonded to the metal base. The first microstrip line, and a capacitor formed by the first conductor pattern and the second conductor pattern may form a matching circuit connected to an input terminal or an output terminal of the amplifier.

(10) A Doherty amplifier according to the present disclosure may includes: a distributor distributing a high-frequency signal into a plurality of high frequency signals; a main amplifier amplifying one of the high frequency signals distributed by the distributor; a peak amplifier amplifying the other of the high-frequency signals distributed by the distributor; a combiner combining the high-frequency signal amplified by the main amplifier and the high-frequency signal amplified by the peak amplifier; a metal base; a first semiconductor chip mounted on the metal base and having the main amplifier formed thereon; a second semiconductor chip mounted on the metal base and having the peak amplifier formed thereon; a dielectric substrate mounted on the metal base and having a first conductor pattern formed on an upper surface thereof and a second conductor pattern formed on a lower surface thereof to form a microstrip line along with the first conductor pattern and the second conductor pattern; an insulator layer provided on the metal base, covering the first semiconductor chip, the second semiconductor chip and the dielectric substrate, and having a dielectric constant smaller than that of the dielectric substrate; a first wiring provided on an upper surface of the insulator layer and electrically connecting an output electrode of the main amplifier in the first semiconductor chip and a first end of the microstrip line; and a second wiring provided on the upper surface of the insulator layer and electrically connecting a second end of the microstrip line and the combiner. Thus, it is possible to provide a Doherty amplifier capable of reducing in size.

Details of Embodiments of the Present Disclosure

Specific examples of a high frequency circuit in accordance with embodiments of the present disclosure are described below with reference to the drawings. The present disclosure is not limited to these examples, but is indicated by the claims, which are intended to include all modifications within the meaning and scope of the claims.

First Embodiment

FIG. 1 is a circuit diagram of a high-frequency device according to a first embodiment. As illustrated in FIG. 1, in a high-frequency device 100, a transmission line Z1 is connected between terminals T1 and T2. A capacitor C101 is shunt-connected to anode N1 on the terminal T1 side of the transmission line Z1, and a capacitor C102 is shunt-connected to a node N2 on the terminal T2 side of the transmission line Z1. The high-frequency device 100 functions as a CLC π-type circuit.

Figure 2:
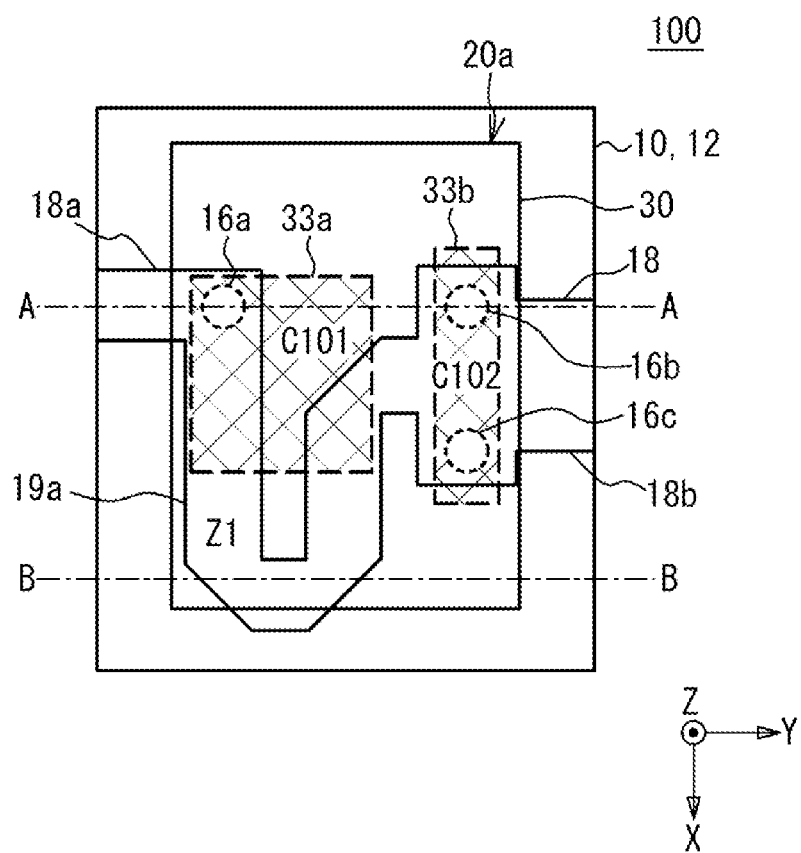
FIG. 2 is a plan view of a high-frequency device according to the first embodiment.
Figure 3:
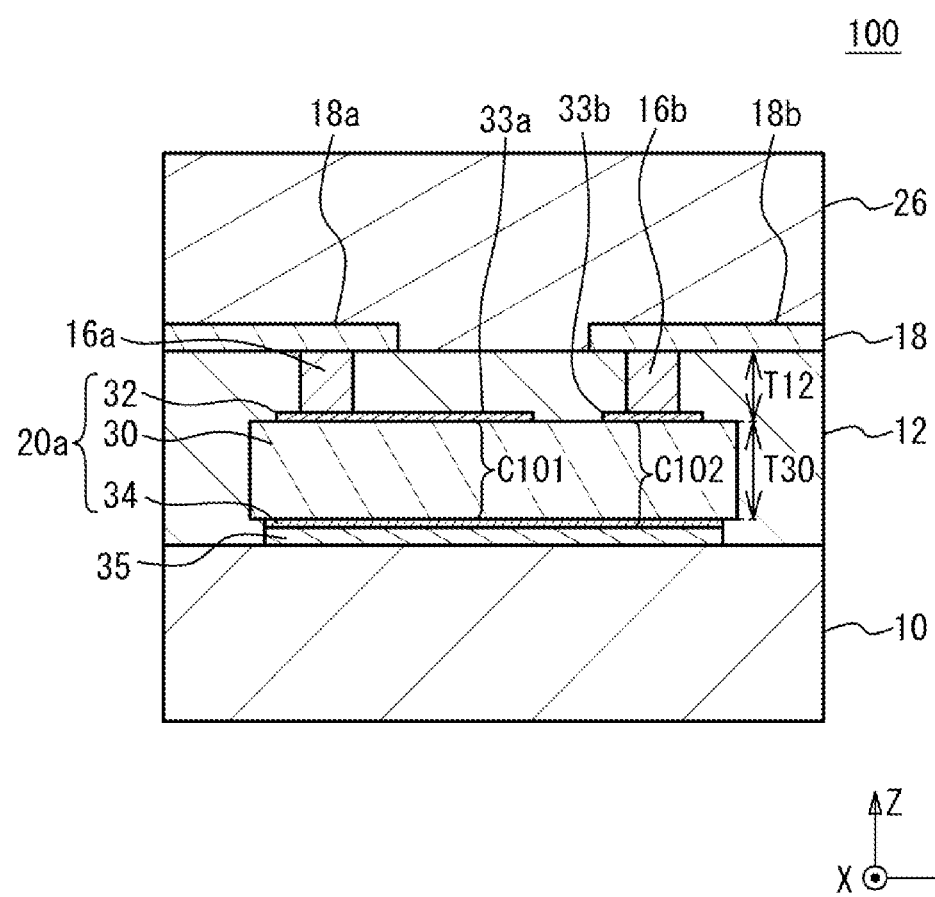
FIG. 3 is a cross-sectional view taken along line A-A of FIG. 2.
Figure 4:
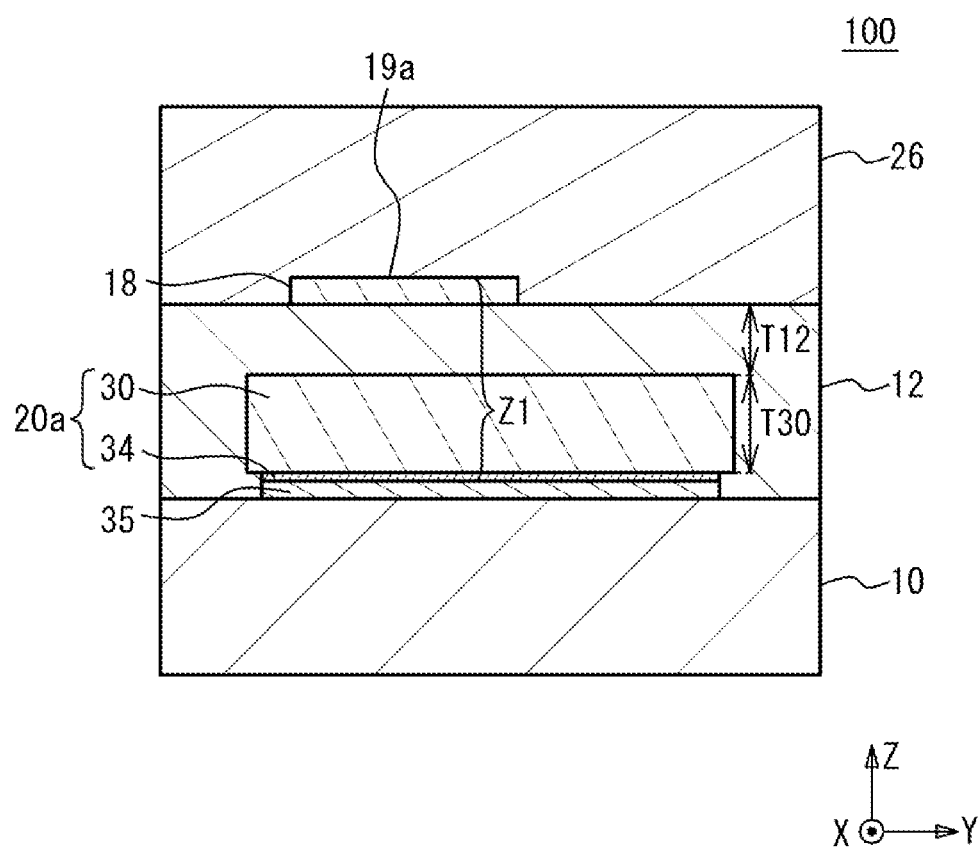
FIG. 4 is a cross-sectional view taken along line B-B of FIG. 2.

FIG. 2 is a plan view of the high-frequency device according to the first embodiment. FIG. 3 is a cross-sectional view taken along line A-A of FIG. 2. FIG. 4 is a cross-sectional view taken along line B-B of FIG. 2. In FIG. 2, an insulator layer 26 is not illustrated, and a metal layer 32 is illustrated by cross hatching. A thickness direction of a metal base 10 is defined as a Z direction, and planar directions of an upper surface of the metal base 10 are defined as an X direction and a Y direction. As illustrated in FIGS. 2 to 4, a passive element 20$a$ is mounted on the metal base 10. The metal base 10 is composed of copper as a main component, for example. The passive element 20$a$ includes a dielectric substrate 30, the metal layer 32 and a conductor pattern 34. The metal layer 32 is provided on the upper surface of the dielectric substrate 30. The metal layer 32 forms conductor patterns 33$a$ and 33$b$. The conductor patterns 33$a$ and 33$b$ are separated from each other on an upper surface of the dielectric substrate 30. The conductor pattern 34 is provided on a lower surface of the dielectric substrate 30. The metal layer 32 and the conductor pattern 34 are metal layers such as a gold layer. The conductor pattern 34 is provided almost entirely on the lower surface of the dielectric substrate 30. The dielectric substrate 30 has a relative dielectric constant of, for example, 3 to 200, which is higher than the relative dielectric constant of the insulator layers 12 and 26. The conductor pattern 34 and the metal base 10 are bonded by a bonding material 35. The bonding material 35 is a material obtained by sintering a metal paste such as a silver paste.

The insulator layer 12 is provided on the metal base 10 so as to cover the passive element 20$a$. The insulator layer 12 is, for example, a resin layer such as epoxy resin. The thickness of the dielectric substrate 30 is T30, and the thickness of the insulator layer 12 on the dielectric substrate 30 which overlaps the dielectric substrate 30 when viewed from the Z direction is T12. Pillars (or through electrodes) 16a, 16b and 16c are provided so as to penetrate through the insulator layer 12. The pillar 16a is provided on the conductor pattern 33a, and the pillars 16b and 16c are provided on the conductor pattern 33b. The pillars 16a, 16b and 16c are metal pillars such as, for example, copper pillars. A metal layer 18 is provided on the insulator layer 12. The metal layer 18 is a rewiring layer, and wirings 18a and 18b and line 19a are formed by the metal layer 18. The metal layer 18 is, for example, a copper layer or a gold layer. The wiring 18a and the line 19a are electrically connected to the conductor pattern 33a through the pillar 16a, and the wiring 18b and the line 19a are electrically connected to the conductor pattern 33b through the pillars 16b and 16c. The insulator layer 26 is provided on the insulator layer 12 so as to cover the metal layer 18. The insulator layer 26 is a resin layer such as an epoxy resin.

The conductor patterns 33a and 34 sandwiching the dielectric substrate 30 form a capacitor C101, and the conductor patterns 33b and 34 sandwiching the dielectric substrate 30 form a capacitor C102. A reference potential such as a ground potential is supplied to the metal base 10. As a result, the conductor pattern 34 becomes the ground potential. The line 19a and the conductor pattern 34 form the transmission line Z1 as a microstrip line. As described above, the capacitors C101 and C102 are shunt-connected to both ends of the transmission line Z1. By using the dielectric substrate 30 for the passive element 20a, the capacitors C101 and C102 can be reduced in size.

First Comparative Example

Figure 5:
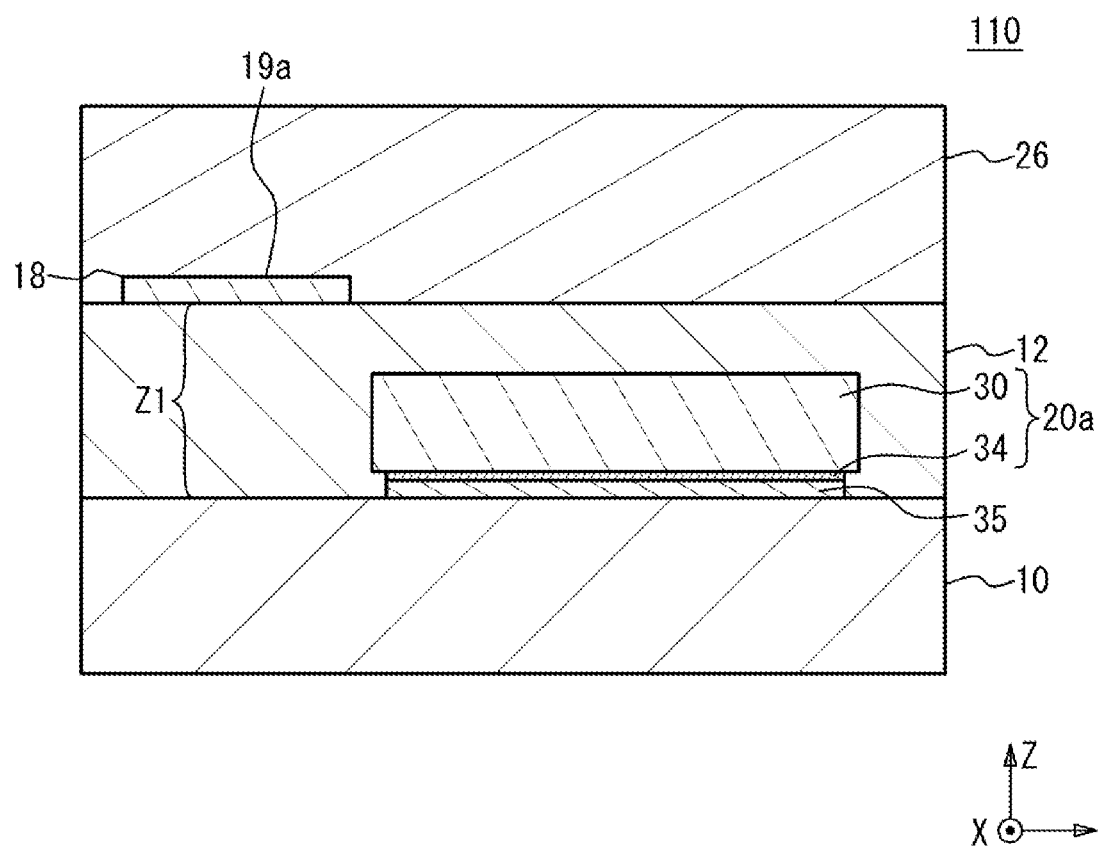
FIG. 5 is a cross-sectional view of a high-frequency device according to a first comparative example.

FIG. 5 is a cross-sectional view of a high-frequency device according to a first comparative example. As illustrated in FIG. 5, in a high-frequency device 110 of the first comparative example, the line 19a formed by the metal layer 18 does not overlap the passive element 20a when viewed from the Z direction. A microstrip line (transmission line Z1) is formed by the line 19a and the metal base 10. In the microstrip line, when the dielectric constant of the dielectric provided between the line 19a and the metal base 10 becomes low, the line width for obtaining the same characteristic impedance becomes large. In addition, the physical line length for obtaining the same electrical length becomes large. In the first comparative example, the dielectric constant of the insulator layer 12 is low, for example, 3 to 5. This is because the insulator layer 12 is provided so as to cover the passive element 20a and the resin layer is used as the insulator layer 12. Therefore, in the first comparative example, the transmission line Z1 becomes large, and the high-frequency device 110 is increased in size.

Second Comparative Example

Figure 6:
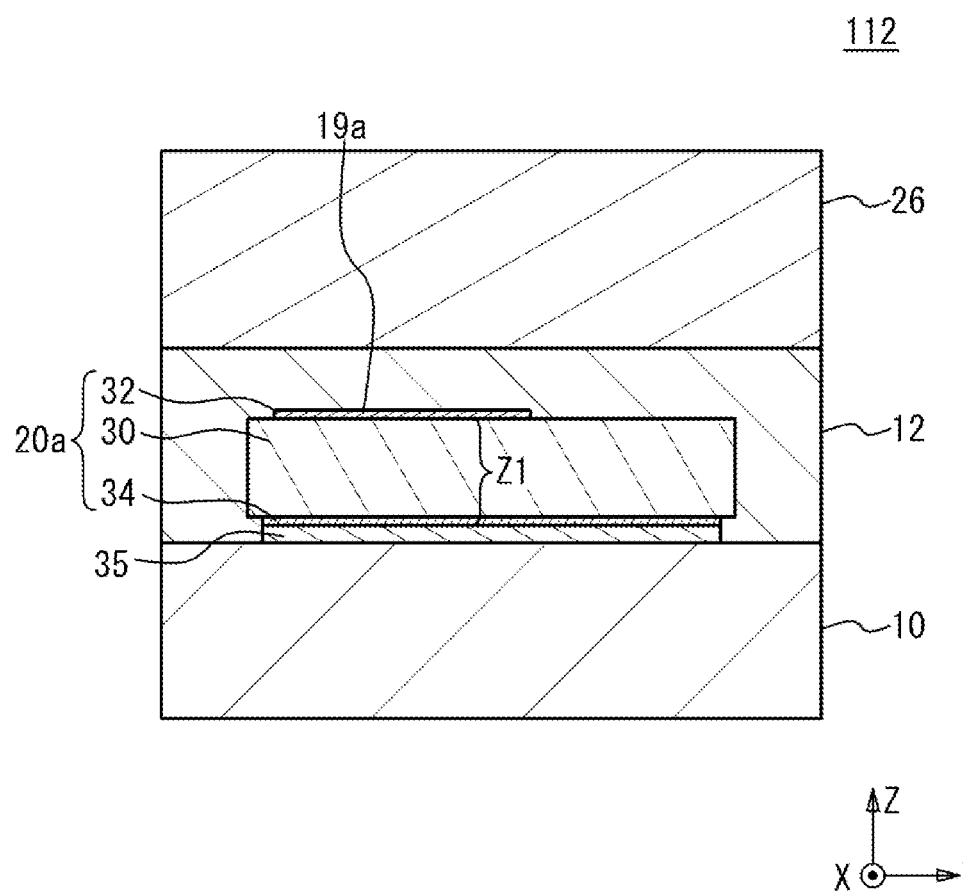
FIG. 6 is a cross-sectional view of a high-frequency device according to a second comparative example.

FIG. 6 is a cross-sectional view of a high-frequency device according to a second comparative example. As illustrated in FIG. 6, in a high-frequency device 112 of the second comparative example, the line 19a is formed of the metal layer 32 provided on the upper surface of the dielectric substrate 30. The microstrip line (transmission line Z1) is formed by the line 19a and the conductor pattern 34 provided on the lower surface of the dielectric substrate 30. In the second comparative example, since the dielectric constant of the dielectric substrate 30 is high, the microstrip line can be made smaller and the high-frequency device can be made smaller. However, when the relative dielectric constant of the dielectric substrate 30 is very large, for example, 40 or more, a dimensional accuracy of the line 19a needs to be increased in order to control the characteristic impedance and electrical length of the microstrip line. When a dielectric loss is $\alpha$, a proportional constant is K, a frequency is f, a relative dielectric constant is $\varepsilon r$, and a dielectric dissipation factor is $\tan \delta$, the dielectric loss $\alpha$ is expressed by $\alpha = K \cdot f \cdot \sqrt{\varepsilon r} \cdot \tan \delta$. Thus, a material having a large relative dielectric constant tends to have a large dielectric loss. Therefore, in the dielectric substrate 30 using a high dielectric, the dielectric loss becomes large, and the loss of electric energy in the dielectric material becomes large.

According to the first embodiment, the dielectric substrate 30 is mounted on the metal base 10. The insulator layer 12 covers the dielectric substrate 30 provided on the metal base 10, and has a dielectric constant smaller than that of the dielectric substrate 30. The line 19a (first line) overlaps the dielectric substrate 30 as viewed from the thickness direction of the insulator layer 12, and is provided on the upper surface of the insulator layer 12 to form the transmission line Z1 (first microstrip line). Thus, the insulator layer 12 and the dielectric substrate 30 are provided between the line 19a and the conductor pattern 34. Accordingly, the relative dielectric constant of a composite layer of the insulator layer 12 and the dielectric substrate 30 becomes high. Therefore, the microstrip line can be made shorter than that of the first comparative example, and the high-frequency device 100 can be made smaller. Further, since the microstrip line can be made larger than that of the second comparative example, the dimensional accuracy of the line 19a may be lower. In addition, loss of electrical energy due to the dielectric substrate 30 can be reduced.

From the viewpoint of reduction in size, the dielectric constant of the dielectric substrate 30 is preferably 1.5 times or more, more preferably 2 times or more, and still more preferably 5 times or more the dielectric constant of the insulator layer 12. The dielectric substrate 30 having a high dielectric constant has a large dielectric loss and is hard to manufacture. From the viewpoint of loss, the dielectric constant of the dielectric substrate 30 is preferably 100 times or less, more preferably 10 times or less, and still more preferably 5 times or less the dielectric layer of the insulator layer 12. For example, when priority is given to reduction in size, the dielectric constant of the dielectric substrate 30 is set to 10 times to 100 times the dielectric constant of the insulator layer 12, and when priority is given to loss, the dielectric constant of the dielectric substrate 30 is set to 1.1 times to 10 times the dielectric constant of the insulator layer 12.

When the thickness T30 of the dielectric substrate 30 is too thin compared to the thickness T12 of the insulator layer 12 on the dielectric substrate 30 overlapping the dielectric substrate 30 when viewed from the Z direction, the transmission line Z1 becomes large, and the high-frequency device is increased in size. From the viewpoint of reduction in size, the thickness T30 of the dielectric substrate 30 is preferably 1/300 times or more, more preferably 1/10 times or more, and still more preferably 1 time or more the thickness T12 of the insulator layer 12 on the dielectric substrate 30. When the thickness T30 of the dielectric substrate 30 is too thick compared to the thickness T12 of the insulator layer 12 on the dielectric substrate 30, the dielectric loss of the dielectric substrate 30 becomes large and the dimensional accuracy needs to be increased. From this viewpoint of loss, the thickness T30 of the dielectric substrate 30 is preferably 1 times or less, more preferably 1/2 times or less, and still more preferably 1/10 times or less the thickness T12 of the insulator layer 12 on the dielectric substrate 30. For example, when priority is given to reduction in size, the thickness T30 of the dielectric substrate 30 is set to $\frac{1}{10}$ to 10 times the thickness T12 of the insulator layer 12, and when priority is given to loss, the thickness T30 of the dielectric substrate 30 is set to $\frac{1}{300}$ to $\frac{1}{10}$ times the thickness T12 of the insulator layer 12.

In the first embodiment, the dielectric substrate 30 includes the conductor pattern 33a (first conductor pattern) provided on the upper surface of the dielectric substrate 30. Thus, the transmission line and the capacitor can be formed by using the conductor pattern.

The line 19a is electrically connected to the conductor pattern 33a. Thus, the transmission line Z1 connected to the conductor pattern 33a can be reduced in size.

The dielectric substrate 30 includes the conductor pattern 34 (second conductor pattern) which is provided on the lower surface of the dielectric substrate 30 and is bonded to the metal base 10. The conductor patterns 33a and 34 form the capacitor C101 (first capacitor). Thus, the capacitor C101 can be reduced in size and the transmission line Z1 can be reduced in size.

The dielectric substrate 30 includes the conductor pattern 33b provided on the upper surface of the dielectric substrate 30. The conductor patterns 33a and 33b are separated from each other on the upper surface of the dielectric substrate 30. The conductor pattern 33b (third conductor pattern) and the conductor pattern 34 form the capacitor C102 (second capacitor). The line 19a electrically connects the conductor patterns 33a and 33b. Thus, a CLC π-type high-frequency device can be obtained. Since the capacitors C101 and C102 are formed of the dielectric substrate 30, they can be reduced in size. Moreover, the transmission line Z1 can be reduced in size.

A region of the line 19a where the metal layer 32 and the line 19a overlap with each other when viewed from the Z direction is not affected by the dielectric substrate 30 and hardly contributes to reduction in size. Therefore, an area of the region of the line 19a where metal layer 32 including the conductor patterns 33a and 33b provided on the upper surface of the dielectric substrate 30, and the line 19a do not overlap with each other when viewed from the Z direction is preferably ½ or more and more preferably ⅔ or more the total area of the line 19a.

First Modification of First Embodiment

Figure 7:
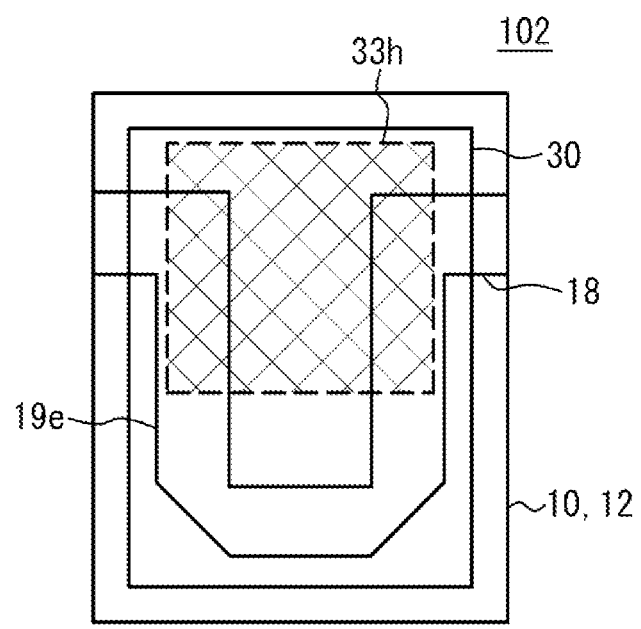
FIG. 7 is a plan view of a high-frequency device according to a first modification of the first embodiment.

FIG. 7 is a plan view of a high-frequency device according to a first modification of the first embodiment. As illustrated in FIG. 7, in a high-frequency device 102 of the first modification of the first embodiment, a conductor pattern 33h is provided on the upper surface of the dielectric substrate 30. In the first modification of the first embodiment, a line 19e is formed on the metal layer 18 as in the first embodiment. The line 19e is not electrically connected to the conductor pattern 33h. Other configurations are the same as those of the first embodiment, and description thereof is omitted. As in the first modification of the first embodiment, the line 19e may not be connected to the conductor pattern 33h. Also in the first modification of the first embodiment, since the line 19e can be mounted small as in the case of the line 19a in the first embodiment, the high-frequency device 102 can be reduced in size.

Second Modification of First Embodiment

Figure 8:
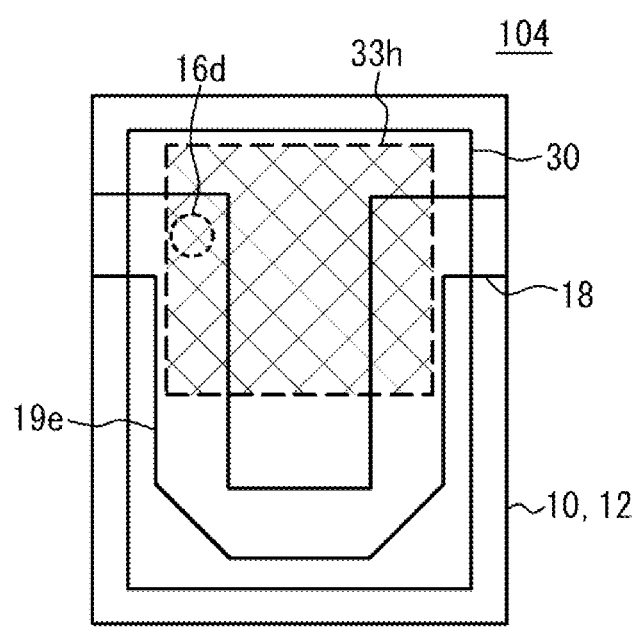
FIG. 8 is a plan view of a high-frequency device according to a second modification of the first embodiment.

FIG. 8 is a plan view of a high-frequency device according to a second modification of the first embodiment. As illustrated in FIG. 8, in a high-frequency device 104 according to the second modification of the first embodiment, the conductor pattern 33h on the upper surface of the dielectric substrate 30 and the line 19e are electrically connected to each other by a pillar 16d. Other configurations are the same as those of the first embodiment, and description thereof is omitted. As in the second modification of the first embodiment, a capacitor may be shunt-connected to the line 19e by the conductor pattern 33h.

Second Embodiment

Figure 9:
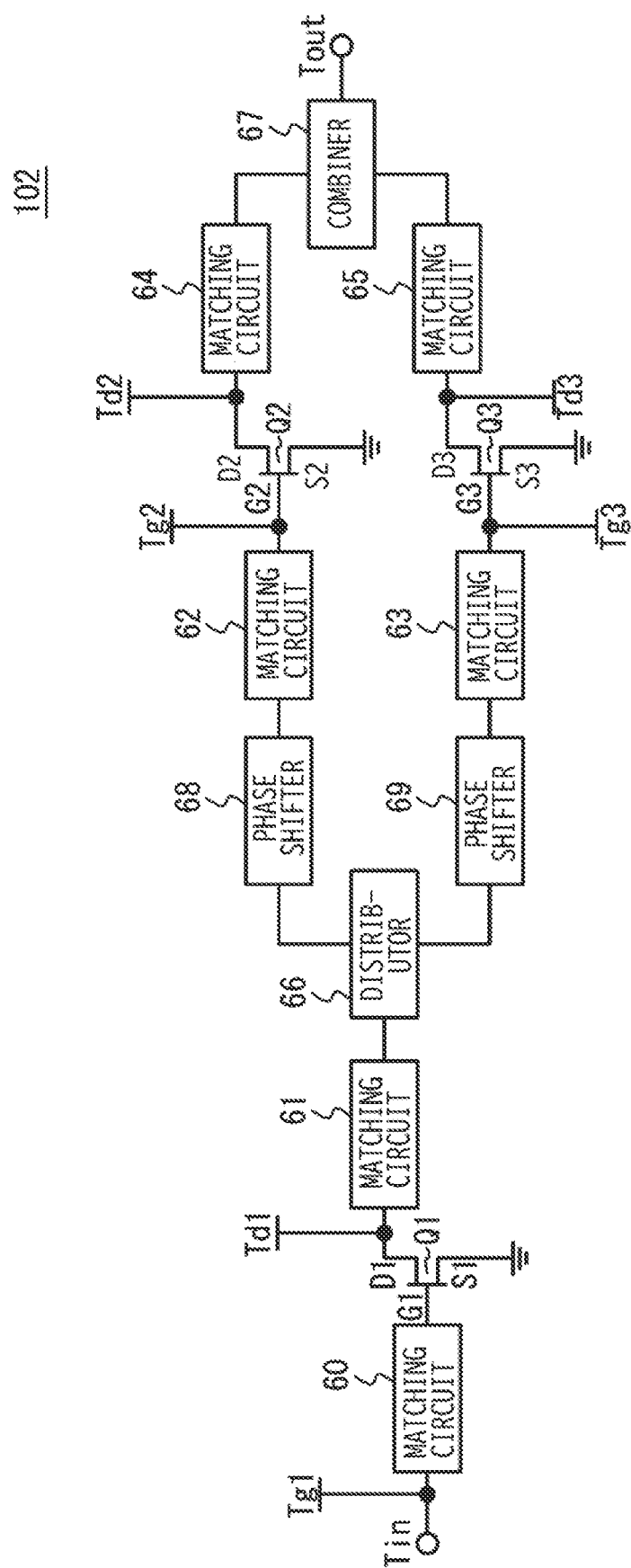
FIG. 9 is a block diagram of an amplifier according to a second embodiment.

A second embodiment indicates an example of an amplifier using the high-frequency device of the first embodiment. FIG. 9 is a block diagram of the amplifier according to the second embodiment. As illustrated in FIG. 9, an amplifier 106 includes transistors Q1 to Q3. The transistors Q1 to Q3 are, for example, FET (Field Effect Transistor), and are, for example, GaN HEMT (Gallium Nitride High Electron Mobility Transistor). The transistor Q1 is a driver amplifier, and the transistors Q2 and Q3 are a main amplifier and a peak amplifier of a Doherty amplifier, respectively.

An input terminal Tin is connected to a gate G1 of the transistor Q1 via a matching circuit 60. The matching circuit 60 matches an impedance seen from the input terminal Tin to the matching circuit 60 with an impedance seen from the matching circuit 60 to the gate G1. A gate bias voltage is applied to the gate G1 from a bias terminal Tg1 through the matching circuit 60. A source S1 of the transistor Q1 is grounded. A drain D1 of the transistor Q1 is connected to a distributor 66 via a matching circuit 61. The matching circuit 61 matches an impedance seen from the drain D1 to the matching circuit 61 with an impedance seen from the matching circuit 61 to the distributor 66. A drain bias voltage is applied to the drain D1 from a bias terminal Td1. The distributor 66 distributes the high-frequency signal output from the matching circuit 61 into two paths.

The distributor 66 is connected to a gate G2 of the transistor Q2 via a phase shifter 68 and a matching circuit 62. The phase shifter 68 shifts the phase of the high-frequency signal output from the distributor 66. The matching circuit 62 matches an impedance seen from the distributor 66 to the matching circuit 62 with an impedance seen from the matching circuit 62 to the gate G2. A gate bias voltage is applied to the gate G2 from a bias terminal Tg2 via the matching circuit 62. A source S2 of the transistor Q2 is grounded. A drain D2 of the transistor Q2 is connected to a combiner 67 via a matching circuit 64. The matching circuit 64 matches an impedance seen from the drain D2 to the matching circuit 64 with an impedance seen from the matching circuit 64 to the combiner 67. A drain bias voltage is applied to the drain D2 from a bias terminal Td2.

The distributor 66 is connected to a gate G3 of the transistor Q3 via a phase shifter 69 and a matching circuit 63. The phase shifter 69 shifts the phase of the high-frequency signal output from the distributor 66. The matching circuit 63 matches an impedance seen from the distributor 66 to the matching circuit 63 with an impedance seen from the matching circuit 63 to the gate G3. A gate bias voltage is applied to the gate G3 from a bias terminal Tg3 via the matching circuit 63. A source S3 of the transistor Q3 is grounded. A drain D3 of the transistor Q3 is connected to the combiner 67 via a matching circuit 65. The matching circuit 65 matches an impedance seen from the drain D3 to the matching circuit 65 with an impedance seen from the matching circuit 65 to the combiner 67. A drain bias voltage is applied to the drain D3 from a bias terminal Td3.

The combiner 67 combines the high-frequency signal output from the drain D2 and the high-frequency signal output from the drain D3 and outputs the combined high-frequency signal to the output terminal Tout. Bias circuits are provided between the bias terminals Tg1 to Tg3 and Td1 to Td3 and the transistors Q1 to Q3, but their illustration is omitted.

The high-frequency signal input from the input terminal Tin is amplified by the transistor Q1. The transistors Q2 and Q3, the distributor 66 and the combiner 67 form a Doherty amplifier. The distributor 66 distributes the amplified high-frequency signal into a plurality of high-frequency signals and outputs them to the transistors Q2 and Q3. The transistor Q2 is a main amplifier and amplifies one of the high-frequency signals distributed by the distributor 66. The transistor Q3 is a peak amplifier and amplifies the other of the high-frequency signals distributed by the distributor 66. The combiner 67 combines the high-frequency signal amplified by the transistor Q2 and the high-frequency signal amplified by the transistor Q3, and outputs the combined high-frequency signal to the output terminal Tout. The high-frequency signal input to the input terminal Tin and output from the output terminal Tout is, for example, a signal of 0.5 GHz to 100 GHz, and typically a signal of 0.5 GHz to 10 GHz.

The transistor Q2 performs class A or class B operation, and transistor Q3 performs class C operation. When the input power is small, the transistor Q2 mainly amplifies the input signal. When the input power increases, the peak of the input signal is amplified by the transistor Q3 in addition to the transistor Q2. Thus, the transistors Q2 and Q3 amplify the input signal. When the input power is small and the transistor Q3 does not operate, the impedance seen from the transistor Q2 to the combiner 67 is twice a load R of the output terminal Tout (for example, 2×50Ω). When the input power is large and the transistor Q3 operates, each of the impedance seen from the transistor Q2 to the combiner 67 and the impedance seen from the transistor Q3 to the combiner 67 is the load R (for example, 50Ω). The matching circuits 62 and 64 are adjusted so that the transistor Q2 operates optimally at the saturated output in the load 2R when the transistor Q3 does not operate, while the matching circuits 62 and 64 are adjusted so that the transistor Q2 operates optimally at the saturated output in the load R when the transistor Q3 operates. The matching circuits 63 and 65 are adjusted so that the impedance viewed from the combiner 67 to the transistor Q3 opens when the transistor Q3 does not operate, while the matching circuits 63 and 65 are adjusted so that the transistor Q3 operates optimally at the saturated output in the load R when the transistor Q3 operates. In order to perform such operation, an impedance converter formed of the transmission line, for example, is used as the matching circuit 64.

Figure 10:
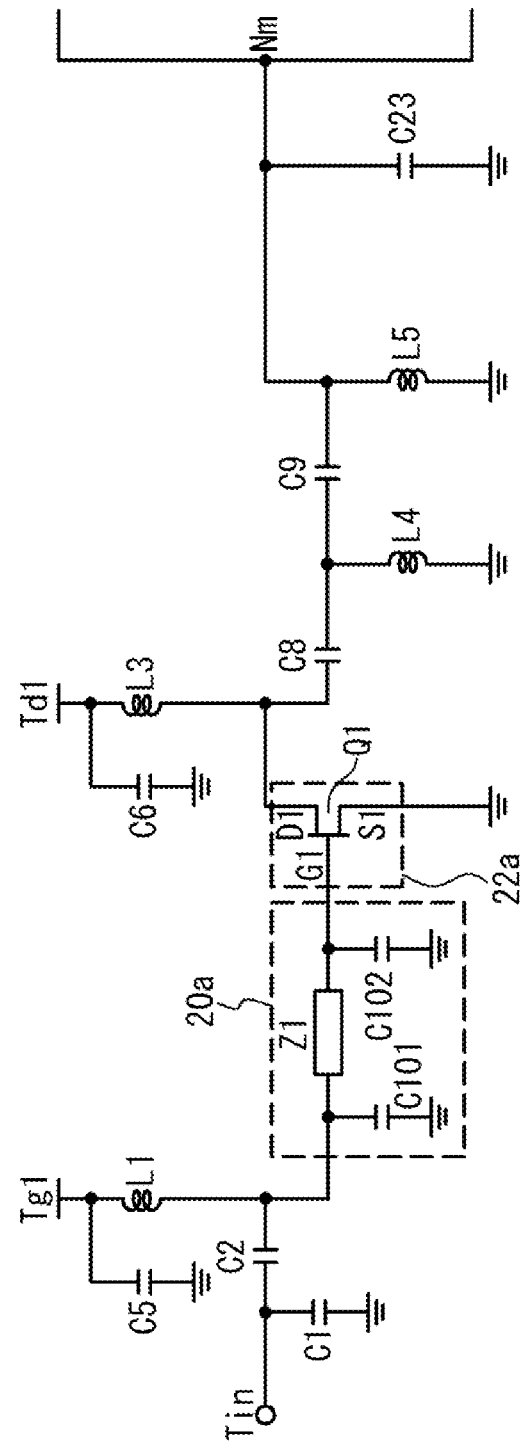
FIG. 10 is a circuit diagram of the amplifier according to the second embodiment.
Figure 11:
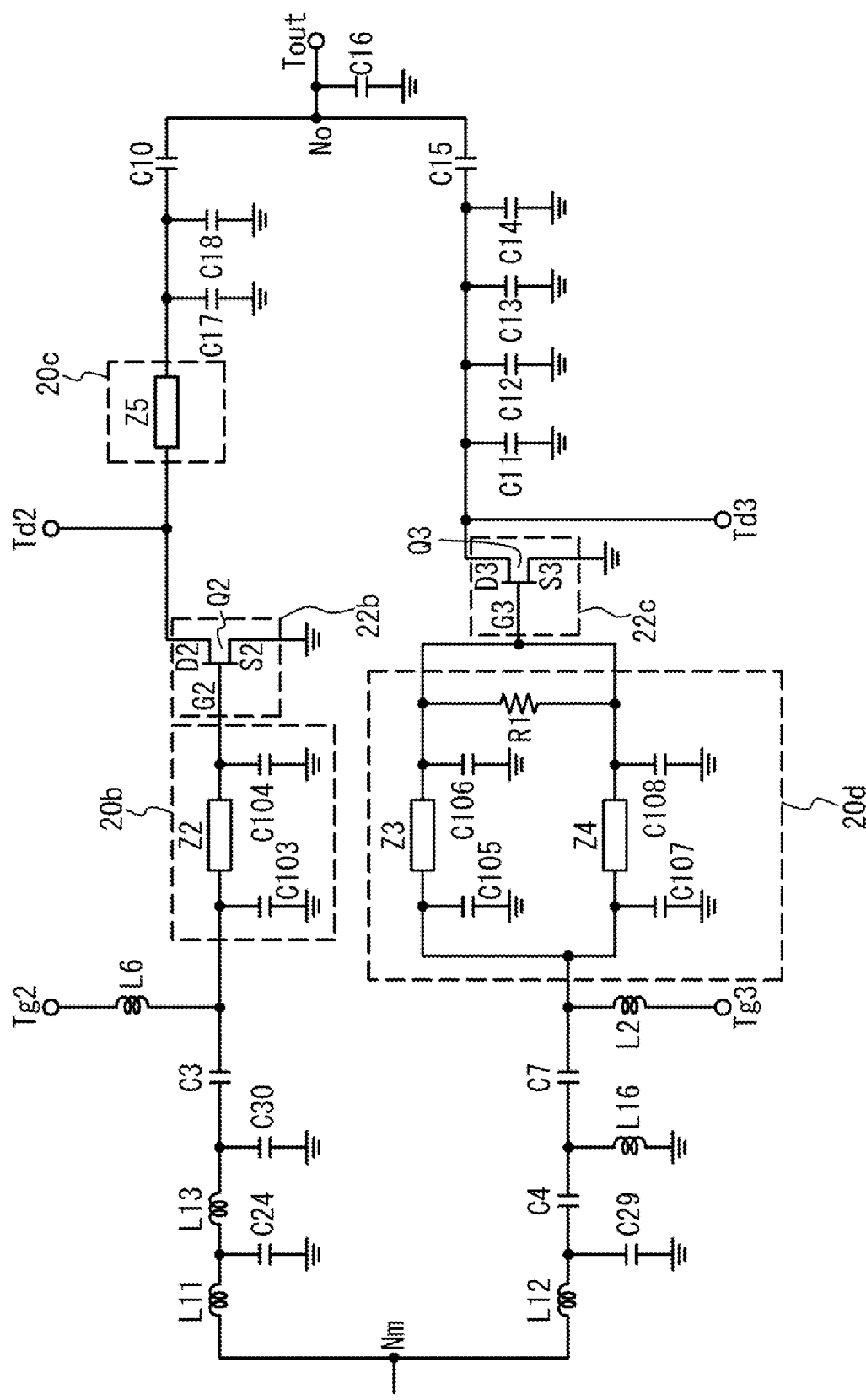
FIG. 11 is a circuit diagram of the amplifier according to the second embodiment.

FIGS. 10 and 11 are circuit diagrams of the amplifier according to the second embodiment. FIG. 10 mainly illustrates a circuit between the input terminal Tin and a node Nm, and FIG. 11 mainly illustrates a circuit between the node Nm and the output terminal Tout. The node Nm is included in the distributor 66 of FIG. 9. As illustrated in FIG. 10, the transistor Q1 is formed on the semiconductor chip 22a. A capacitor C1 is shunt-connected between the input terminal Tin and the gate G1 of the transistor Q1, and a capacitor C2 and the passive element 20a are connected in series between the input terminal Tin and the gate G1 of the transistor Q1. The passive element 20a is a CLC π-type circuit including the transmission line Z1 and capacitors C101 and C102. The passive element 20a forms at least a part of the matching circuit 60 (see FIG. 9). An inductor L1 is connected between the bias terminal Tg1 and a node between the capacitor C2 and the passive element 20a. A capacitor C5 is shunt-connected to a node between the inductor L1 and the bias terminal Tg1. The inductor L1 and the capacitor C5 form at least a part of a bias circuit.

Capacitors C8 and C9 are connected in series between the drain D1 and the node Nm. An inductor L4 is shunt-connected to a node between the capacitors C8 and C9, and an inductor L5 and a capacitor C23 are shunt-connected to the node Nm. The inductors L4, L5 and the capacitor C9 form at least a part of the matching circuit 61 (see FIG. 9). An inductor L3 is connected between the bias terminal Td1 and a node between the drain D1 and the capacitor C8. A capacitor C6 is shunt-connected to a node between the inductor L3 and the bias terminal Td1. The inductor L3 and the capacitor C6 form at least a portion of a bias circuit.

As illustrated in FIG. 11, the transistors Q2 and Q3 are formed on semiconductor chips 22b and 22c, respectively. The node Nm forms at least part of the distributor 66 (see FIG. 9) and a node No forms at least part of the combiner 67 (see FIG. 9). Inductors L11 and L13, a capacitor C3 and a passive element 20b are connected in series between the node Nm and the gate G2 of the transistor Q2. Capacitors C24 and C30 are shunt-connected to a node between the inductors L11 and L13 and to a node between the inductor L13 and the capacitor C3, respectively. The inductors L11, L13 and the capacitors C24 and C30 form at least a part of the phase shifter 68 (see FIG. 9). The passive element 20b is a CLC π-type circuit including a transmission line Z2 and capacitors C103 and C104. The passive element 20b forms at least a part of the matching circuit 62 (see FIG. 9). An inductor L6 is connected between the bias terminal Tg2 and a node between the capacitor C3 and the passive element 20b. The inductor L6 forms at least a part of a bias circuit. The passive element 20c and a capacitor C10 are connected in series between the drain D2 and the node No. Capacitors C17 and C18 are shunt-connected to a node between the passive element 20c and the capacitor C10. The passive element 20c includes a transmission line Z5 and forms at least a part of the matching circuit 64 (see FIG. 9).

An inductor L12, capacitors C4 and C7, and the passive element 20d are connected in series between the node Nm and the gate G3 of the transistor Q3. A capacitor C29 and an inductor L16 are shunt-connected to a node between the inductor L12 and the capacitor C4 and to a node between the capacitors C4 and C7, respectively. The inductors L12 and L16 and the capacitors C4 and C29 form at least a part of the phase shifter 69 (see FIG. 9). The passive element 20d has a CLC π-type circuit including a transmission line Z3 and capacitors C105 and C106, and a CLC π-type circuit including a transmission line Z4 and capacitors C107 and C108. The CLC π-type circuits are connected in parallel. The passive element 20d forms at least a part of the matching circuit 63 (see FIG. 9). An inductor L2 is connected between the bias terminal Tg3 and a node between the capacitor C7 and the passive element 20d. The inductor L2 forms at least a part of a bias circuit. A capacitor C15 is connected in series between the drain D3 and the node No. Capacitors C11 to C14 are shunt-connected to a node between the drain D3 and the capacitor C15. The drain D3 and the capacitors C11 to C14 form at least a part of the matching circuit 65 (see FIG. 9).

Figure 12:
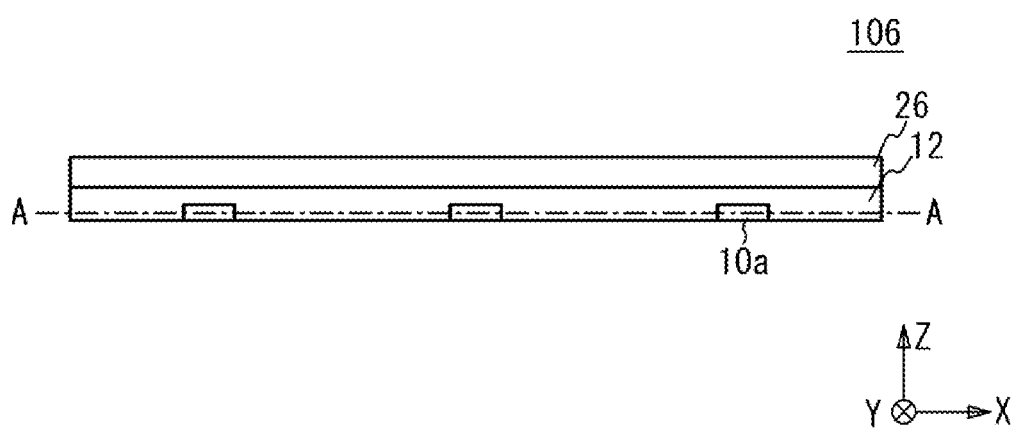
FIG. 12 is a side view of the amplifier according to the second embodiment.
Figure 13:
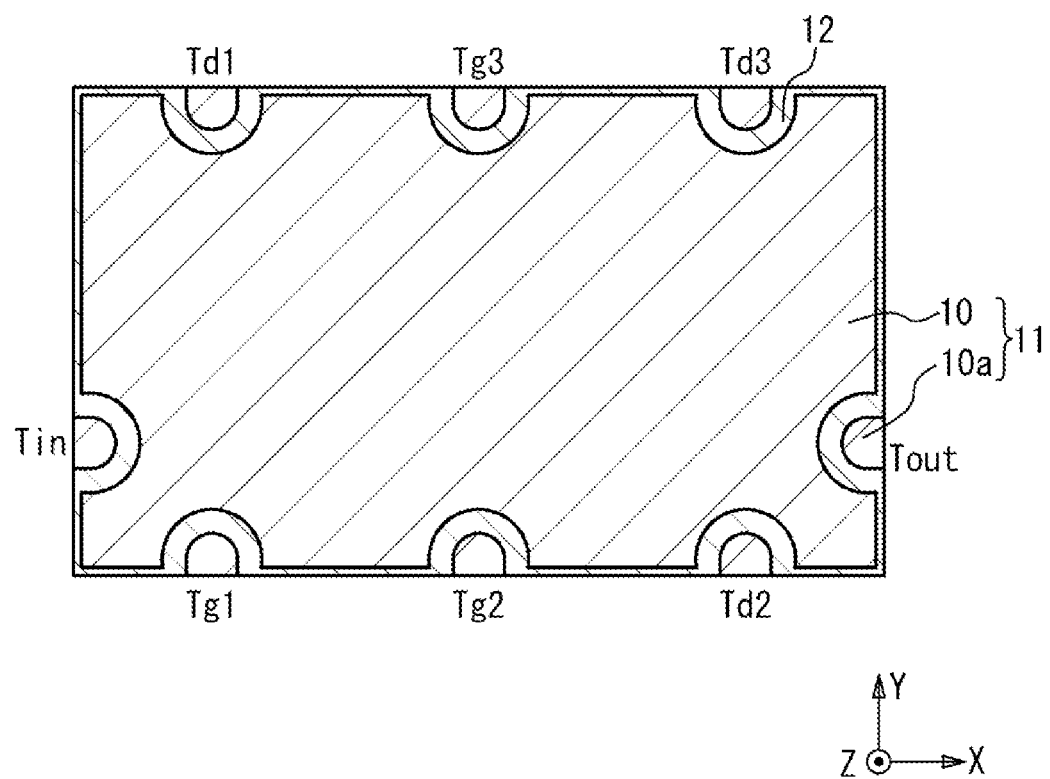
FIG. 13 is a cross-sectional view taken along line A-A of FIG. 12.

FIG. 12 is a side view of the amplifier 106 according to the second embodiment. FIG. 13 is a cross-sectional view taken along line A-A of FIG. 12. As illustrated in FIGS. 12 and 13, the amplifier 106 includes a lead frame 11 and the insulator layers 12 and 26 provided on the lead frame 11. The lead frame 11 includes the metal base 10 and terminals 10a. The metal base 10 is exposed from the lower surface of the insulator layer 12. The terminals 10a are exposed from the lower surface and the side surface of the insulator layer 12. The metal base 10 and the terminals 10a are electrically separated from each other by an insulator layer 12. A ground potential is supplied to the metal base 10. The terminals 10a corresponds to the input terminal Tin, the output terminal Tout, and the bias terminals Tg1 to Tg3 and Td1 to Td3. The lead frame 11 is, for example, a copper plate plated with silver. The insulator layers 12 and 26 are resin layers such as an epoxy resin.

Figure 14:
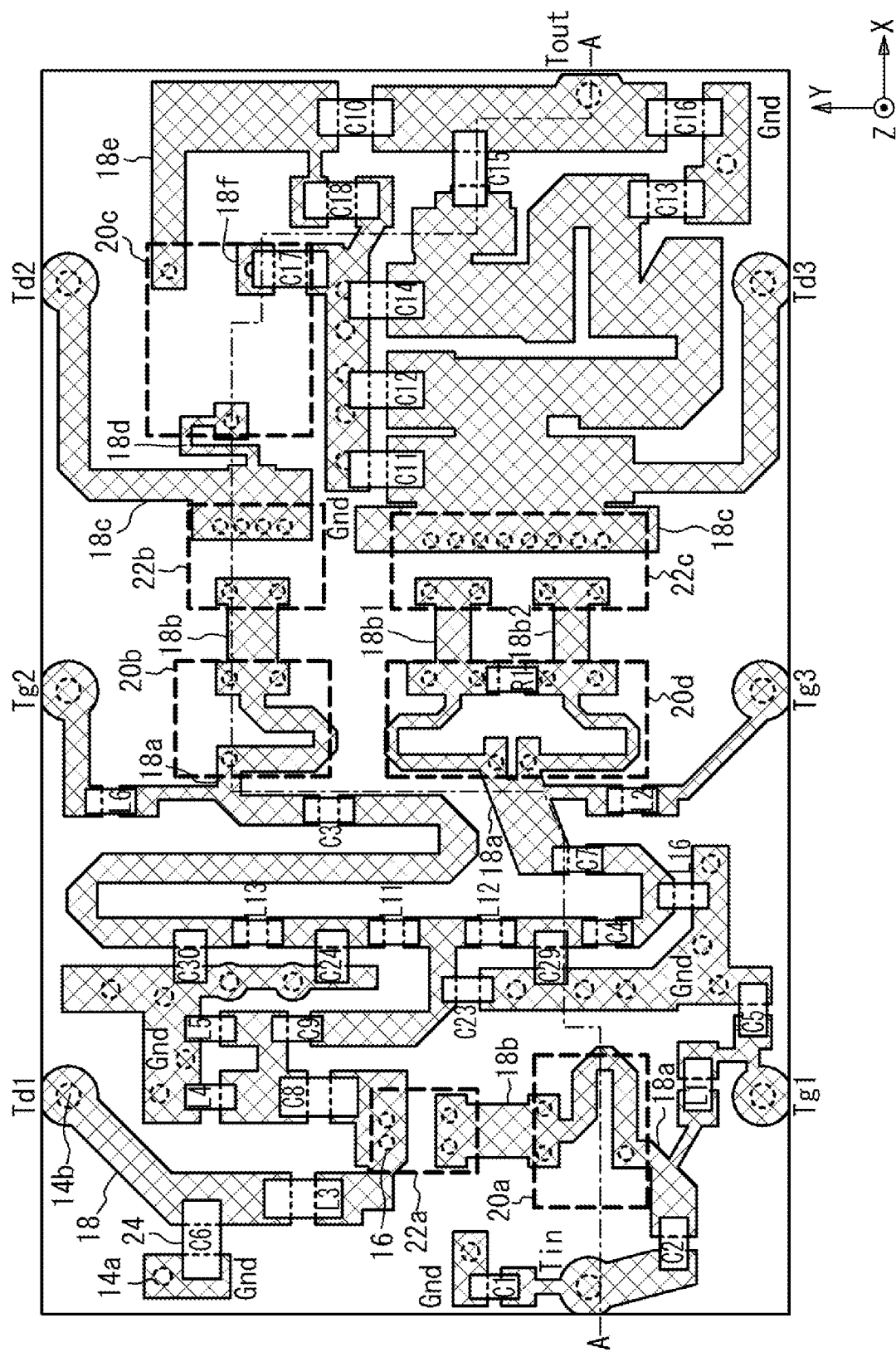
FIG. 14 is a plan view of an amplifier according to the second embodiment.
Figure 15:
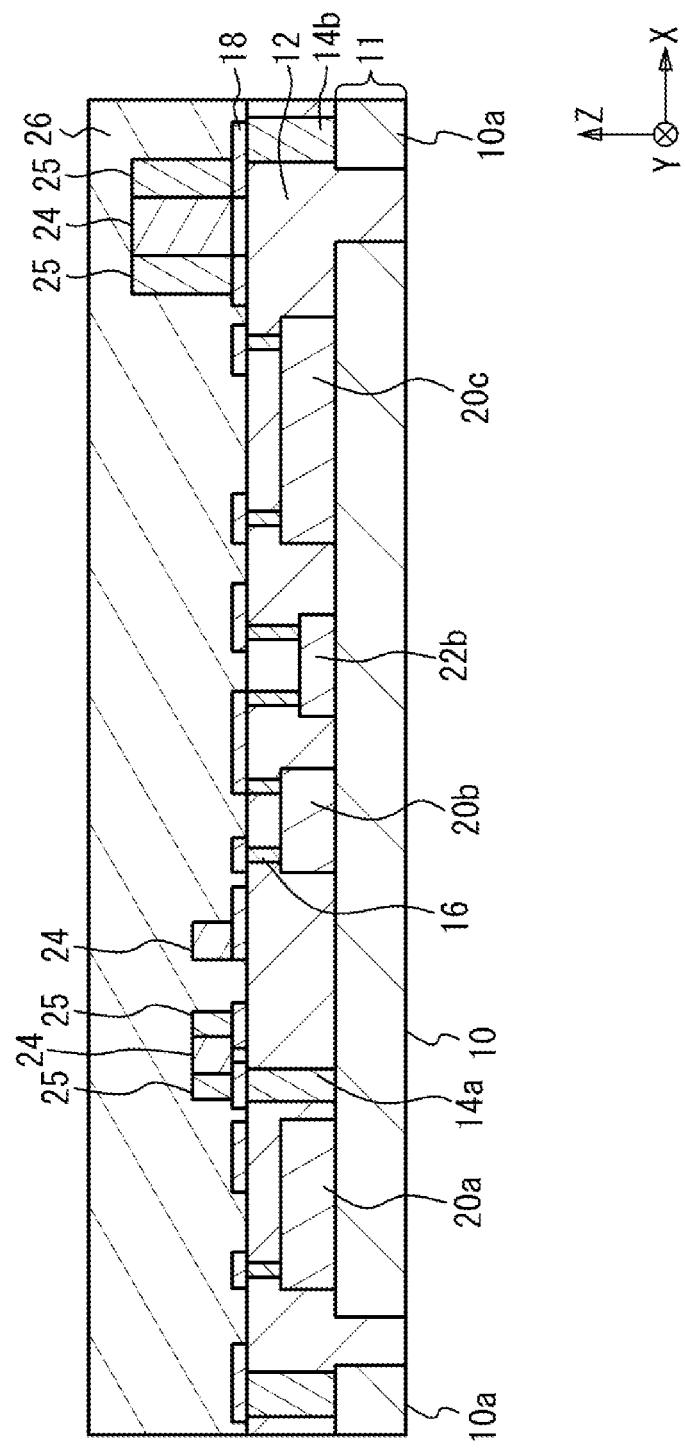
FIG. 15 is a cross-sectional view taken along line A-A of FIG. 14.

FIG. 14 is a plan view of the amplifier 106 according to the second embodiment. FIG. 15 is a cross-sectional view taken along line A-A of FIG. 14. FIG. 14 mainly illustrates the metal layer 18, through electrodes 14a and 14b, pillars 16, the passive elements 20a to 20d and the semiconductor chips 22a to 22c. The metal layer 18 is illustrated by cross hatching. Large dashed line circles illustrated in the metal layer 18 indicate the through electrodes 14b, small dashed circles indicate the pillars 16, and dashed circles having a middle size between the sizes of the through electrodes 14b and the pillars 16 indicating the through electrodes 14a. FIG. 15 is a schematic diagram, and a dimension in the X direction do not correspond to that in FIG. 14. It is assumed that a thickness direction of the metal base 10 is a Z direction, a long side direction of the high-frequency device is an X direction, and a short side direction thereof is a Y direction.

As illustrated in FIG. 15, the passive elements 20a to 20d and the semiconductor chips 22a to 22c are mounted on the metal base 10 (see FIG. 14). For example, a sintered silver paste is used to bond the passive elements 20a to 20d and the semiconductor chips 22a to 22c to the metal base 10. The insulator layer 12 is provided on the lead frame 11 so as to cover the passive elements 20a to 20d and the semiconductor chips 22a to 22c. The upper surface of the insulator layer 12 is substantially flat. The metal layer 18 is provided on the insulator layer 12. The metal layer 18 forms a rewiring layer. The metal layer 18 is, for example, a gold layer or a copper layer.

The through electrodes 14a and 14b penetrating the insulator layer 12 are provided. The through electrode 14a electrically connects and short-circuits the metal layer 18 and the metal base 10. The through electrode 14b electrically connects and short-circuits the metal layer 18 and the terminals 10a. The through electrodes 14a and 14b are, for example, a gold layer or a copper layer. The pillars 16 penetrating the insulator layer 12 and connecting the metal layer 18 to the passive elements 20a to 20d and the semiconductor chips 22a to 22c is provided. The pillar 16 is, for example, a gold layer or a copper layer. Electronic components 24 are mounted on the insulator layer 12. Electrodes 25 of the electronic components 24 are bonded to the metal layer 18. A solder such as SnAgCu is used for bonding the electrodes 25 and the metal layer 18. The electronic components 24 are, for example, discrete components, and include a chip resistor, a chip capacitor, and a chip inductor. The insulator layer 26 is provided on the insulator layer 12 so as to cover the electronic components 24. The insulator layer 26 is a resin layer such as an epoxy resin. The lead frame 11 has a thickness of, for example, 200 μm, the insulator layer 12 has a thickness of, for example, 200 μm, and the insulator layer 26 has a thickness of, for example, 400 μm.

As illustrated in FIG. 14, the rewiring layer made of the metal layer 18 is provided on the insulator layer 12. The through electrode 14b electrically connects the metal layer 18 to the input terminal Tin, the output terminal Tout, and the bias terminals Tg1 to Tg3 and Td1 to Td3 as the terminals 10a. The through electrode 14a electrically connects the metal layer 18 to the metal base 10. The metal layer 18 electrically connected to the metal base 10 by the through electrode 14a becomes a ground pattern Gnd. The electronic components 24 such as the capacitor, the inductor and the resistor are mounted on the metal layer 18. The pillars 16 electrically connects the metal layer 18 to the conductor patterns provided on the upper surfaces of the passive elements 20a to 20d and the semiconductor chips 22a to 22c.

The passive elements 20a and 20b corresponds to the passive elements 20a illustrated in FIGS. 1 to 4 of the first embodiment. In FIG. 14, the wiring 18a extending from a lower side in the Y direction of four sides of the passive element 20a is connected to the capacitor C2 and the inductor L1, and the wiring 18b extending from an upper side in the Y direction of four sides of the passive element 20a is connected to the semiconductor chip 22a. As illustrated in FIGS. 1 to 4, the passive element 20a functions as the capacitors C101 and C102, and the line 19a above the passive element 20a functions as the transmission line Z1. The conductor patterns 33a and 33b illustrated in FIGS. 1 to 4 are omitted and not illustrated in FIGS. 14 and 15. In the passive element 20b, the wiring 18a is connected to the capacitor C3 and the inductor L6, and the wiring 18b is connected to the semiconductor chip 22b (see FIG. 14). Similarly to the capacitors C101 and C102 of the passive element 20a, the passive element 20b functions as the capacitors C103 and C104, and the line above the passive element 20b (line corresponding to the line 19a in FIG. 2) functions as the transmission line Z2. The passive element 20a and the transmission line Z1 function as the matching circuit 60, and the passive element 20b and the transmission line Z2 function as the matching circuit 62.

Figure 16:
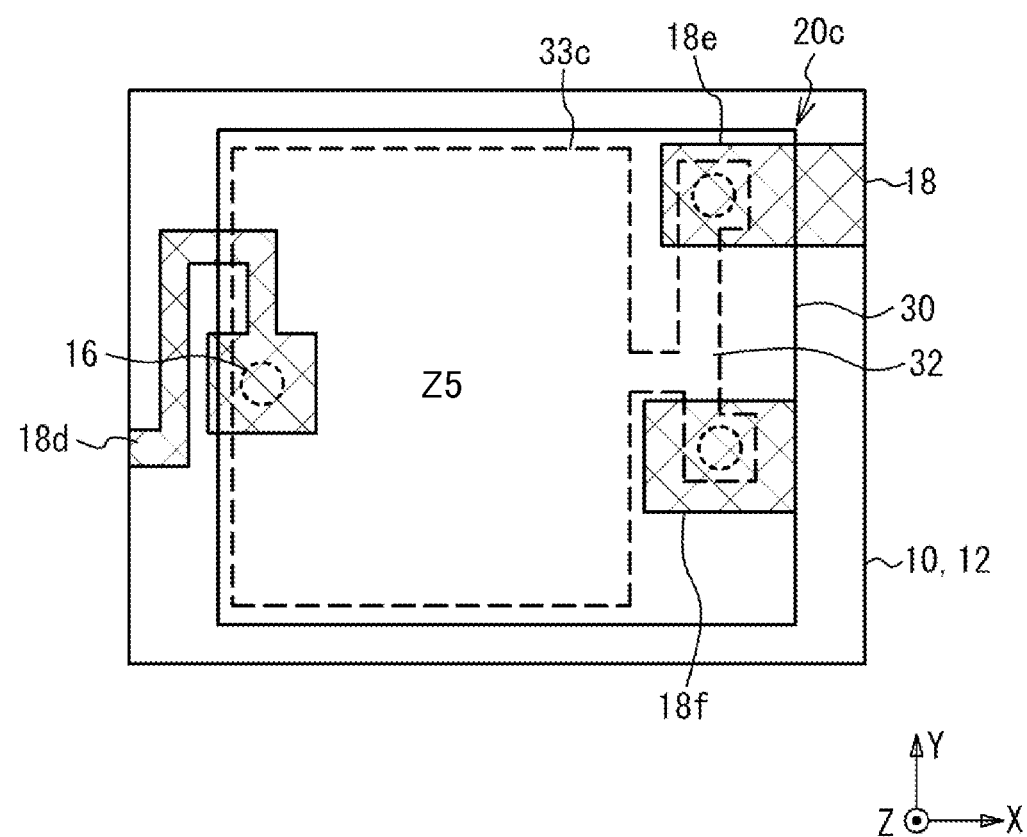
FIG. 16 is a plan view of the vicinity of a passive element 20c according to the second embodiment.

FIG. 16 is a plan view of the vicinity of a passive element 20c according to the second embodiment. A conductor pattern 33c is provided on the dielectric substrate 30. In FIGS. 14 and 15, the conductor pattern 33c is omitted and not illustrated. Wirings 18d to 18f are formed of the metal layer 18. The wiring 18d is connected to the semiconductor chip 22b, the wiring 18e is connected to the capacitor C10, and the wiring 18f is connected to the capacitor C17 (see FIG. 14). Each of the wirings 18d to 18f is electrically connected to the conductor pattern 33c via the pillar 16. The conductor pattern 33c and the conductor pattern 34 (see FIGS. 3 and 4) provided on the lower surface of the dielectric substrate 30 form the transmission line Z5. The transmission line Z5 forms a part of the matching circuit 64. The cross-sectional structure of the passive element 20c is the same as that illustrated in FIGS. 3 and 4, and description thereof is omitted.

Figure 17:
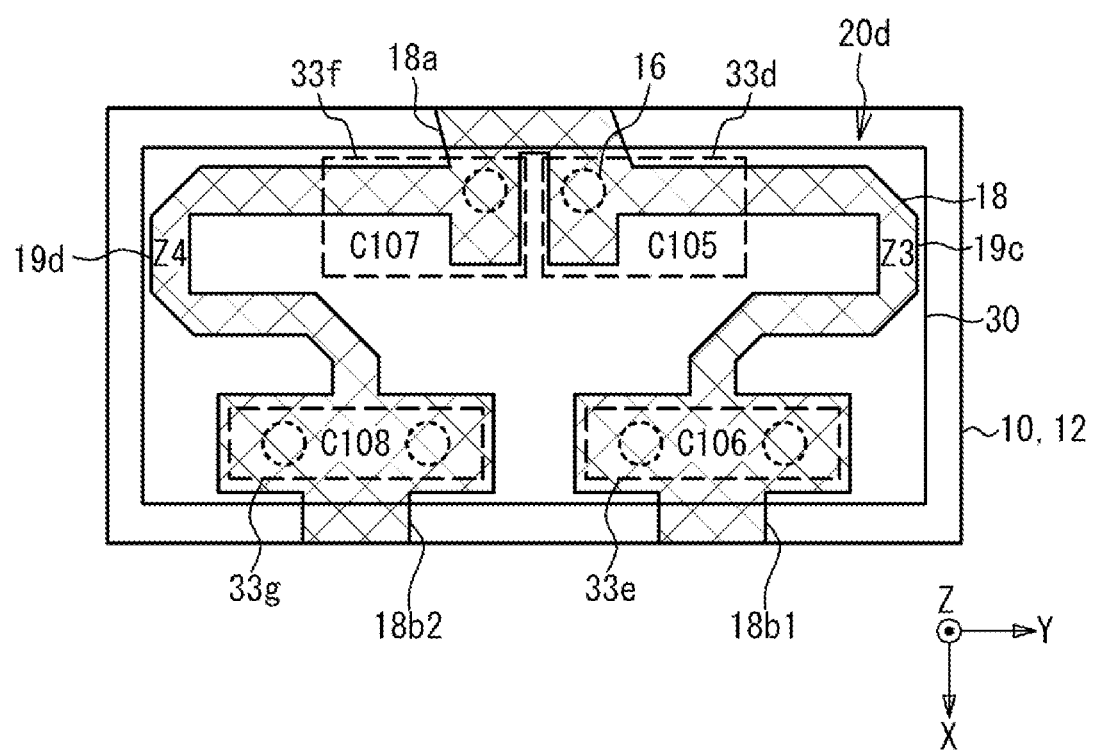
FIG. 17 is a plan view of the vicinity of a passive element 20d according to the second embodiment.

FIG. 17 is a plan view of the vicinity of the passive element 20d according to the second embodiment. Conductor patterns 33d to 33g are provided on the dielectric substrate 30. In FIGS. 14 and 15, the conductor patterns 33d to 33g are omitted and not illustrated. The metal layer 18 forms lines 19c and 19d. The wiring 18a is connected to the capacitor C7 and the inductor L2, and the wiring 18b1 and 18b2 are connected to the semiconductor chip 22c (see FIG. 14). The line 19c electrically connects the conductor patterns 33d and 33e via the pillars 16. The line 19d electrically connects the conductor patterns 33f and 33g via the pillars 16. The conductor patterns 33d and the conductor pattern 34

(see FIGS. 3 and 4) provided on the lower surface of the dielectric substrate 30 form the capacitor C105, the conductor patterns 33e and the conductor pattern 34 form the capacitor C106, the conductor patterns 33f and the conductor pattern 34 form the capacitor C107, and the conductor patterns 33g and the conductor pattern 34 form the capacitor C108. The line 19c and the conductor pattern 34 form the transmission line Z3, and the line 19d and the conductor pattern 34 form transmission line Z4. The passive element 20d and the lines 19c and 19d function as the matching circuit 63. The cross-sectional structure of the passive element 20d is the same as that illustrated in FIGS. 3 and 4, and description thereof is omitted.

In FIGS. 3 and 4, a total thickness "T30+T12" of the thickness T30 of the dielectric substrate 30 and the thickness T12 of the insulator layer 12 on the dielectric substrate 30 is, for example, 200 µm to 250 µm. The dielectric constant of the insulator layer 12 is, for example, 3.0 to 3.5. When reduction in size is given priority, the relative dielectric constant of the dielectric substrate 30 in the passive elements 20a, 20b and 20d is, for example, 150, and the thickness T30 of the dielectric substrate 30 is, for example, 120 µm. The relative dielectric constant of the dielectric substrate 30 in the passive element 20c is 40, for example, and the thickness T30 of the dielectric substrate 30 is 120 µm, for example. When giving priority to loss, the relative dielectric constant of the dielectric substrate 30 in the passive elements 20a to 20d is, for example, 5 to 30, and the thickness T30 of the dielectric substrate 30 is, for example, 1 µm to 25 µm.

Figure 18:
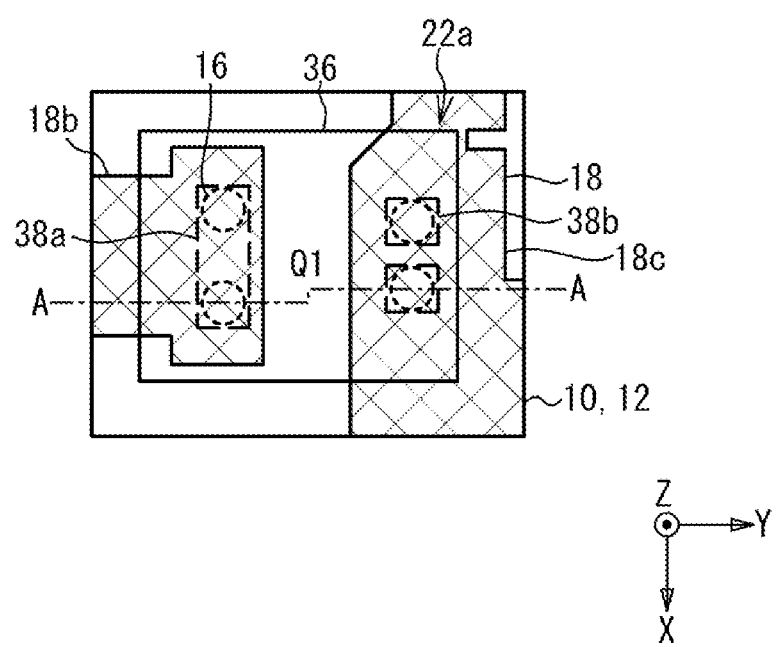
FIG. 18 is a plan view of the vicinity of a semiconductor chip 22a according to the second embodiment.
Figure 19:
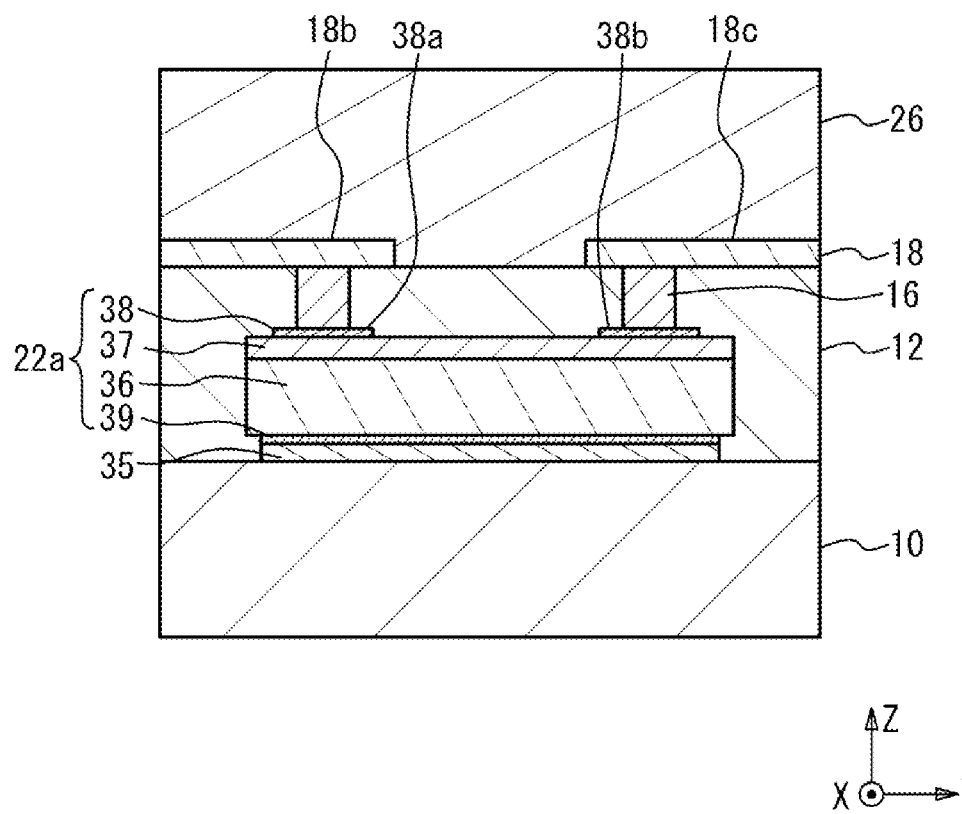
FIG. 19 is a cross-sectional view taken along line A-A of FIG. 18.

FIG. 18 is a plan view of the vicinity of the semiconductor chip 22a according to the second embodiment. FIG. 19 is a cross-sectional view taken along line A-A of FIG. 18. As illustrated in FIGS. 18 and 19, in the semiconductor chip 22a, a semiconductor layer 37 is provided on a substrate 36. When the transistors Q1 to Q3 are GaN HEMTs, the substrate 36 is, for example, a SiC substrate, a sapphire substrate or the like. The semiconductor layer 37 includes a GaN channel layer and an AlGaN barrier layer. A metal layer 38 is provided on the upper surface of the semiconductor layer 37, and a metal layer 39 is provided on the lower surface of the substrate 36. The metal layer 38 forms a gate electrode 38a and a drain electrode 38b. In FIGS. 14 and 15, the gate electrode 38a and the drain electrode 38b are omitted and are not illustrated as conductor patterns. The metal layer 39 is electrically connected to, for example, the source electrode. The metal layer 39 is bonded to the metal base 10 via the bonding material 35. The bonding material 35 is, for example, a sintered metal paste. The wirings 18b and 18c are electrically connected to the gate electrode 38a and the drain electrode 38b via the pillars 16, respectively. The wiring 18b is connected to the passive element 20a, and the wiring 18c is connected to the capacitor C8 and the inductor L3 (see FIG. 14).

Figure 20:
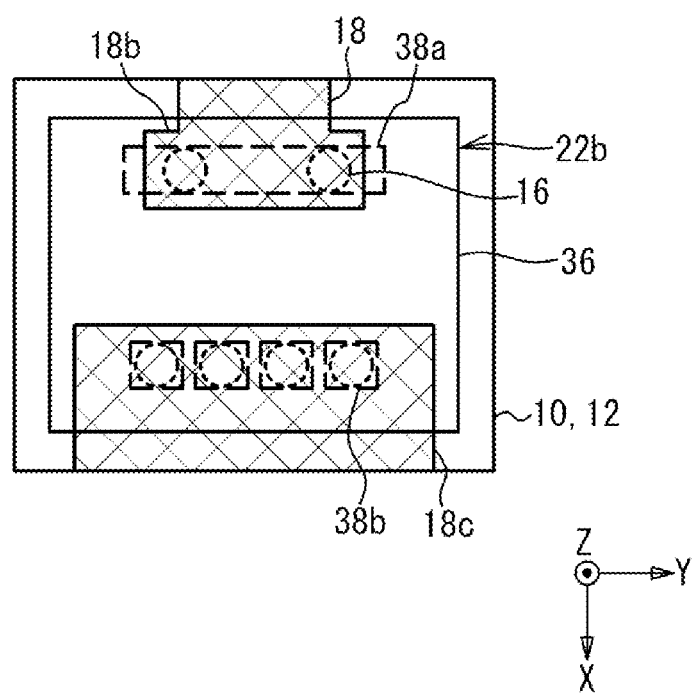
FIG. 20 is a plan view of the vicinity of a semiconductor chip 22b according to the second embodiment.

FIG. 20 is a plan view of the vicinity of the semiconductor chip 22b according to the second embodiment. As illustrated in FIG. 20, in the semiconductor chip 22b, the wirings 18b and 18c are electrically connected to the gate electrode 38a and the drain electrode 38b via the pillars 16, respectively. In FIGS. 14 and 15, the gate electrode 38a and the drain electrode 38b are omitted and are not illustrated as the conductor patterns. The source electrode is electrically connected to the metal base 10. The wiring 18b is connected to the passive element 20b, and the wiring 18c is connected to the passive element 20c and the bias terminal Td2 (see FIG. 14). The cross-sectional structure of the semiconductor chip 22b is the same as that illustrated in FIG. 19, and description thereof will be omitted.

Figure 21:
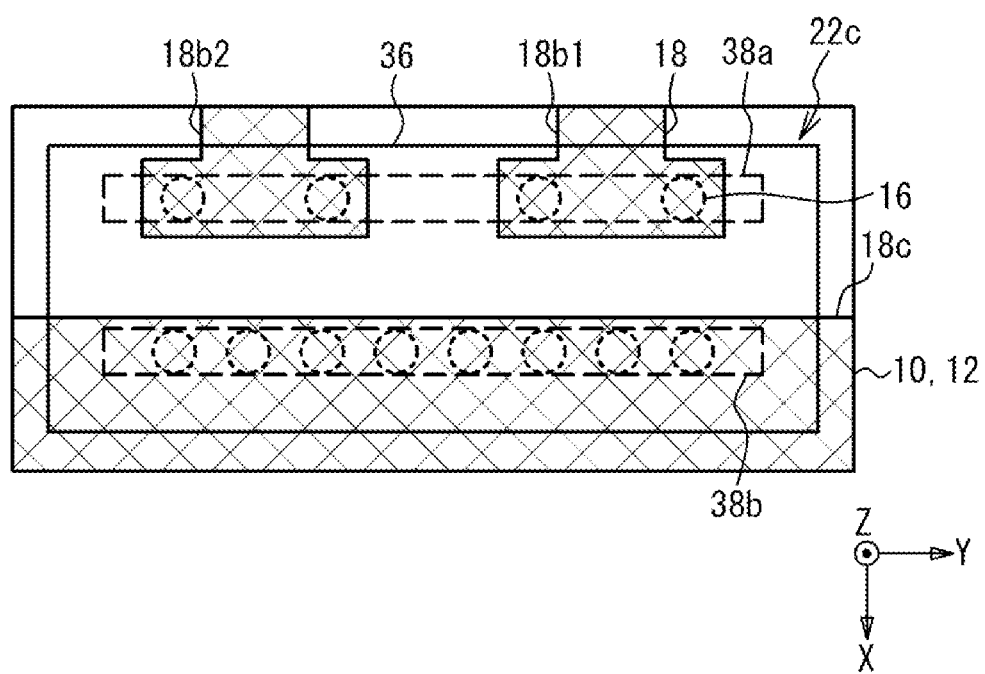
FIG. 21 is a plan view of the vicinity of a semiconductor chip 22c according to the second embodiment.

FIG. 21 is a plan view of the vicinity of the semiconductor chip 22c according to the second embodiment. As illustrated in FIG. 21, in the semiconductor chip 22c, the wirings 18b1 and 18b2 are electrically connected to the gate electrode 38a through the pillars 16, and the wiring 18c is electrically connected to the drain electrode 38b through the pillars 16. In FIGS. 14 and 15, the gate electrode 38a and the drain electrode 38b are omitted and are not illustrated as the conductor patterns. The source electrode is electrically connected to the metal base 10. The wirings 18b1 and 18b2 are connected to the passive element 20d, and the wiring 18c is connected to the capacitors C11 to C15 and the bias terminal Td3 (see FIG. 14). The cross-sectional structure of the semiconductor chip 22c is the same as that illustrated in FIG. 19, and description thereof will be omitted.

In the second embodiment, the line (second line: for example, the line between the inductor L11 and the capacitor C3 in FIG. 14) provided on the upper surface of the insulator 12 without overlapping with the dielectric substrate 30 when viewed from the Z direction forms a second microstrip line along with the metal base 10. Thus, the first line overlapping the dielectric substrate 30 as viewed from the Z direction and the second line not overlapping the dielectric substrate 30 can be used according to the purpose. For example, when importance is attached to the size, the first line overlapping the dielectric substrate 30 when viewed from the Z direction is used, and when importance is attached to the loss, the second line not overlapping the dielectric substrate 30 when viewed from the Z direction is used.

The semiconductor chips 22a to 22c are mounted on the metal base 10. The insulator layer 12 covers the semiconductor chips 22a to 22c. Thus, the passive elements 20a to 20d and the semiconductor chips 22a to 22c can be mounted on the same metal base 10.

The electronic components 24 are mounted on the insulator layer 12. The wirings formed by the metal layer 18 are provided on the upper surface of the insulator layer 12 and connects the semiconductor chips 22a to 22c and the electronic components 24. Thus, the electronic components 24 can be mounted on the insulator layer 12.

The semiconductor chips 22a to 22c include transistors Q1 to Q3 as amplifier, respectively. Like the passive elements 20a, 20b and 20d, the microstrip lines of transmission lines Z1, Z2, Z3 and Z4 and capacitors C101 to C108 form the matching circuits 60, 62 and 63 connected to the input or output terminals of transistors Q1 to Q3. Thus, the matching circuits 60, 62 and 63 can be reduced in size.

An impedance converter is used as the matching circuit 64 of the main amplifier (the transistor Q2) in the Doherty amplifier. The impedance converter is formed by the transmission line (e.g., the microstrip line). An electrical length of the transmission line is, for example, ¼ wavelength. When the impedance converter is formed using the microstrip line composed of the metal layer 18 and the metal base 10, if the relative dielectric constant of the insulator layer 12 is 3.3 and the thickness thereof is 200 µm, the width and length of a line for 3.6 GH are 400 µm and 12.8 mm, respectively. Assuming a characteristic impedance of 5.4Ω and an electric length of 28°, the line becomes shorter but wider, and the width and length of the line become 7.2 mm and 3.6 mm. Thus, the impedance converter is increased in size.

In the second embodiment, as illustrated in FIGS. 14 to 16, the semiconductor chip 22b (first semiconductor chip) on which the transistor Q2 (main amplifier) is formed and the semiconductor chip 22c (second semiconductor chip) on which the transistor Q3 (peak amplifier) is formed are mounted on the metal base 10. Further, the dielectric substrate 30 in which the conductor pattern 33c (first conductor pattern) is formed on the upper surface thereof, the conductor pattern 34 (second conductor pattern) is formed on the lower surface thereof, and the transmission line Z5 (microstrip line) is formed by the conductor patterns 33c and 34, is mounted on the metal base 10. The insulator layer 12 is provided on the metal base 10 and covers the semiconductor chips 22b and 22c and the dielectric substrate 30. The wiring 18d (first wiring) is provided on the upper surface of the insulator layer 12 and electrically connects the drain electrode 38b (output electrode of the main amplifier) of the semiconductor chip 22b and a first end of the transmission line Z5. The wiring 18e (second wiring) is provided on the upper surface of the insulator layer 12 and electrically connects a second end of the transmission line Z5 and the combiner 67. Since the dielectric constant of the dielectric substrate 30 is higher than that of the insulator layer 12, the impedance converter formed by the transmission line Z5 can be reduced in size. For example, when the relative dielectric constant of the dielectric substrate 30 is 40 and the thickness of the dielectric substrate 30 is 120 μm, a line having a characteristic impedance of 5.4Ω and an electric length of 28° can be realized in a size of 1.1 mm×1.1 mm.

When priority is given to reduction in size, the dielectric constant of the dielectric substrate 30 is preferably 10 times to 100 times the dielectric constant of the insulator layer 12. When priority is given to loss, the dielectric constant of the dielectric substrate 30 is preferably 1.1 to 10 times the dielectric constant of the insulator layer 12.

In the second embodiment, the amplifier is described as an example of the high-frequency device, but the high-frequency device may be a device other than the amplifier. Although the Doherty amplifier has been described as an example of the amplifier, an amplifier other than the Doherty amplifier may be used. Although the example in which the high-frequency device includes four passive elements 20a to 20d and three semiconductor chips 22a to 22c has been described, the high-frequency device may include one or more passive elements and may include one or more semiconductor chips.

The embodiments disclosed here should be considered illustrative in all respects and not restrictive. The present disclosure is not limited to the specific embodiments described above, but various variations and changes are possible within the scope of the gist of the present disclosure as described in the claims.

What is claimed is:

1. A high-frequency device comprising:
a metal base;
a dielectric substrate mounted on the metal base;
an insulator layer provided on the metal base, covering the dielectric substrate, the insulator layer having a relative dielectric constant εrI and the dielectric substrate having a relative dielectric constant εrS, the ratio εrS/εrI being from 1.1 to 10; and
a first line that overlaps the dielectric substrate as seen from a thickness direction of the insulator layer and is provided on an upper surface of the insulator layer to form a first microstrip line;
wherein a combined thickness T=T30+T12 of (i) the dielectric substrate and (ii) a portion of the insulator layer that overlaps the dielectric substrate is 200 μm to 250 μm.

2. The high-frequency device according to claim 1, wherein
the dielectric substrate includes a first conductor pattern provided on an upper surface of the dielectric substrate, and
the first line is electrically connected to the first conductor pattern.

3. The high-frequency device according to claim 2, wherein
the dielectric substrate includes a second conductor pattern provided on a lower surface of the dielectric substrate and bonded to the metal base, and
the first conductor pattern and the second conductor pattern form a first capacitor.

4. The high-frequency device according to claim 3, wherein
the dielectric substrate includes a third conductor pattern provided on the upper surface of the dielectric substrate and separated from the first conductor pattern on the upper surface of the dielectric substrate to form a second capacitor along with the second conductor pattern, and
the first line electrically connects the first conductor pattern and the third conductor pattern.

5. The high-frequency device according to claim 1, wherein
a region of the first line which does not overlap with a metal layer provided on the upper surface of the dielectric substrate when viewed from the thickness direction of the insulator layer is equal to or more than a half of a whole region of the first line.

6. The high-frequency device according to claim 1, further comprising
a second line which does not overlap with the dielectric substrate when viewed from the thickness direction of the insulator layer and is provided on the upper surface of the insulator layer to form a second microstrip line along with the metal base.

7. The high-frequency device according to claim 1, further comprising
a semiconductor chip provided on the metal base,
wherein the insulator layer covers the semiconductor chip.

8. The high-frequency device according to claim 7, further comprising:
an electronic component mounted on the insulator layer; and
a wiring provided on an upper surface of the insulator layer and connecting the semiconductor chip and the electronic component.

9. The high-frequency device according to claim 1, further comprising
a semiconductor chip mounted on the metal base and including an amplifier,
wherein the insulator layer covers the semiconductor chip,
the dielectric substrate includes a first conductor pattern provided on an upper surface of the dielectric substrate and a second conductor pattern provided on a lower surface of the dielectric substrate and bonded to the metal base, and
the first microstrip line, and a capacitor formed by the first conductor pattern and the second conductor pattern form a matching circuit connected to an input terminal or an output terminal of the amplifier.

10. A Doherty amplifier comprising:
a metal base;
a dielectric substrate mounted on the metal base;

an insulator layer provided on the metal base and covering the dielectric substrate, the insulator layer having a relative dielectric constant εrI and the dielectric substrate having a relative dielectric constant εrS, a ratio εrS/εrI being from 2 to 10; and a first line that overlaps the dielectric substrate as seen from a thickness direction of the insulator layer and is provided on an upper surface of the insulator layer to form a first microstrip line along with the metal base;

wherein a combined thickness T of (i) the dielectric substrate and (ii) a portion of the insulator layer that overlaps the dielectric substrate is 200 μm to 250 μm;

a power dividing circuit configured to divide an input signal;

a main amplifier and a peak amplifier mounted on the metal base and respectively supplied with divided signals from the power dividing circuit;

an output combining circuit configured to combine outputs of the main amplifier and the peak amplifier; and wiring provided on the upper surface of the insulator layer that connects a drain of the main amplifier to one end of the first microstrip line and connects another end of the first microstrip line to the output combining circuit, whereby the first microstrip line constitutes an impedance converting section in an output matching circuit of the main amplifier.

* * * * *